(12) United States Patent
Ni et al.

(10) Patent No.: US 10,768,675 B1
(45) Date of Patent: Sep. 8, 2020

(54) FLEXIBLE CHASSIS PARTITION

(71) Applicant: QUANTA COMPUTER INC., Taoyuan (TW)

(72) Inventors: Hsiao-Tsu Ni, Taoyuan (TW); Yaw-Tzorng Tsorng, Taoyuan (TW); Chun Chang, Taoyuan (TW); Cheng-Chieh Weng, Taoyuan (TW); Ming-Lung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/419,754

(22) Filed: May 22, 2019

(51) Int. Cl.
*G06F 1/18* (2006.01)
*H05K 7/20* (2006.01)

(52) U.S. Cl.
CPC .............. *G06F 1/187* (2013.01); *G06F 1/181* (2013.01); *G06F 1/183* (2013.01); *H05K 7/20727* (2013.01); *G06F 2200/163* (2013.01)

(58) Field of Classification Search
CPC .......... G06F 1/181; G06F 1/183; G06F 1/187; G06F 2200/163; H05K 7/20727
See application file for complete search history.

(56) References Cited

U.S. PATENT DOCUMENTS

| | | | | |
|---|---|---|---|---|
| 4,327,835 A * | 5/1982 | Leger | .................. | H05K 7/1425 211/41.17 |
| 6,058,016 A * | 5/2000 | Anderson | ............... | G06F 1/184 312/223.2 |
| 6,728,114 B2 * | 4/2004 | Serjack | ................ | H05K 7/1418 211/41.17 |
| 6,999,319 B2 * | 2/2006 | Wu | .......................... | G06F 1/184 174/555 |
| 7,558,074 B2 * | 7/2009 | Liang | ..................... | G06F 1/183 174/50 |
| 2013/0170130 A1 * | 7/2013 | Lai | .......................... | G06F 1/187 361/679.33 |

* cited by examiner

*Primary Examiner* — Nidhi Thaker
(74) *Attorney, Agent, or Firm* — Nixon Peabody LLP (57) ABSTRACT

The present disclosure provides for a partition in a chassis, which can transition between at least two positions to receive more than one configuration of modules. The partition can include a first end and a second end, each of which has resting positions adjacent to the chassis body. The partition can further include a middle portion, which is in a raised position above the floor of the chassis body, but can bend flexibly towards the floor. In a first configuration of the chassis, a single, larger module can slide over the partition. In a second configuration of the chassis, two smaller modules can slide into adjacent positions in the chassis body, separated by the partition.

16 Claims, 6 Drawing Sheets

FLEXIBLE CHASSIS PARTITION

FIELD

The present disclosure relates to a chassis partition.

BACKGROUND

Computer chassis can be used in rack systems to hold a variety of computer components, which have many different sizes. For example, a single computer chassis can hold multiple modules, where each module is configured to hold specific computer components. In order to hold multiple modules within one computer chassis, conventional chassis need to be permanently configured with partitions according to the size of the modules. Partitions provide the structural support for a computer chassis to hold more than one module.

However, these permanent partitions, as used in conventional chassis, force users to maintain a large variety of chassis bodies that are configured to support every combination of module sizes. If a single module needs to be switched out with another module of a different size, the entire computer chassis needs to be replaced. This results in high costs because all possible chassis partition configurations must be supported and readily available for use. This also results in additional burdens because any size change in the installed equipment necessitates replacing the entire computer chassis.

Therefore, there is a need for a computer chassis design that does not require switching out the entire chassis when replacing modules in a computer chassis, where the replacement modules do not have the same size as the original modules.

SUMMARY

The various examples of the present disclosure are directed towards a partition for a chassis. The partition can include a first end portion, a second end portion, and a middle portion. Both end portions can include a receiving element that can couple with a chassis body. Both end portions can also have a resting position adjacent with or below a floor of the chassis body. The middle portion can be in a raised position above the floor of the chassis body. The middle portion can flexibly bend towards the floor of the chassis body.

In some examples, the middle portion can shift to a lowered position, where the middle portion is at or below the floor of the chassis body. In some examples, the middle portion can shift into the lowered position upon receiving an applied force.

In some examples, the middle portion can be made of a plastic, a metal, and/or a metal/plastic composite.

In some examples, the middle portion can include a flat center with tapered ends. The tapered ends can be adjacent to the first and second end portions of the partition. These tapered ends can allow a module to slide over the partition. Such a module can transition the middle portion into the lowered position, due to a weight of the module on the partition.

In some examples, the middle portion can include an option for receiving indents.

In some examples, the first and second end can include ridges; the ridges can increase flexibility of the partition to bend below the raised position.

In some examples, the first and second end can include a stake. The stake can snap into an opening. For example, the opening can be in the chassis body.

In another embodiment of the present disclosure, a chassis can include at least one removable module, a chassis body, and a flexible partition. The chassis body can receive the removable module, and can further include an opening. The flexible partition can be received within the chassis body opening. The flexible partition can be as described above with respect to the first embodiment. Various examples of the additional embodiment can be provided as described above with respect to the first embodiment.

In some examples, the opening can include at least one indent. The middle portion can include an option which is configured to receive the at least one indent.

In some examples, the chassis body can have receiving portions. The first and second end portions can have stakes configured to mechanically couple with the receiving portion.

In some examples, the chassis body can have a first configuration where a single module is loaded into the chassis. For example, the single module can slidably extend over the flexible partition and drive the flexible partition into a lowered configuration.

In some examples, the chassis body can have a second configuration where two modules are loaded into the chassis. For example, a first module can be received on a first side of the flexible partition, and a second module can be received on a second side of the flexible partition.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In response to the limitations of conventional chassis bodies, the present disclosure provides for a flexible chassis partition. The disclosed partition can shift between at least two positions to receive more than one configuration of modules. An exemplary first configuration can receive a first module of a wider width, and an exemplary second configuration can receive two modules, each with smaller widths than the module in the first configuration. The partition can include a first end and a second end, each of which has resting positions adjacent to the chassis body. The partition can further include a middle portion, which is in a raised position above the floor of the chassis body, but can bend flexibly towards the floor. The single, larger module, for the first configuration, can slide over the partition, and cause the middle portion to bend towards the floor of the chassis body. The two smaller modules can slide into adjacent positions in the chassis body, separated by the partition. Additional, non-limiting benefits and characteristics are discussed further herein.

Figure 1:
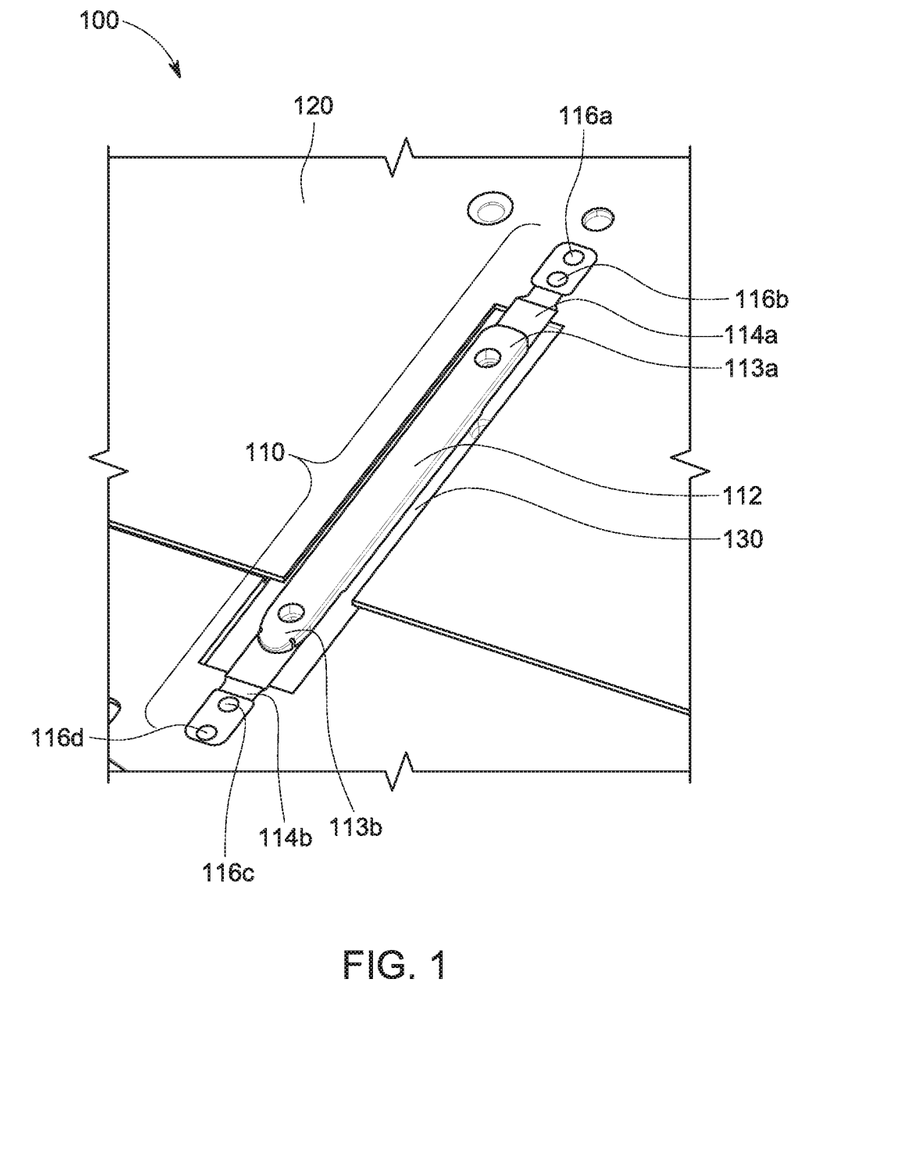
FIG. 1 shows an exemplary partition received into an opening of a chassis, according to an embodiment of the present disclosure.

FIG. 1 shows an exemplary chassis 100, according to an embodiment of the present disclosure. Chassis 100 can include a flexible partition 110, a chassis body 120, and an opening 130. The flexible partition 110 can include a middle portion 112; a first end 114a; a second end 114b; and a plurality of receiving portions 116a, 116b, 116c, and 116d.

Figure 4A:
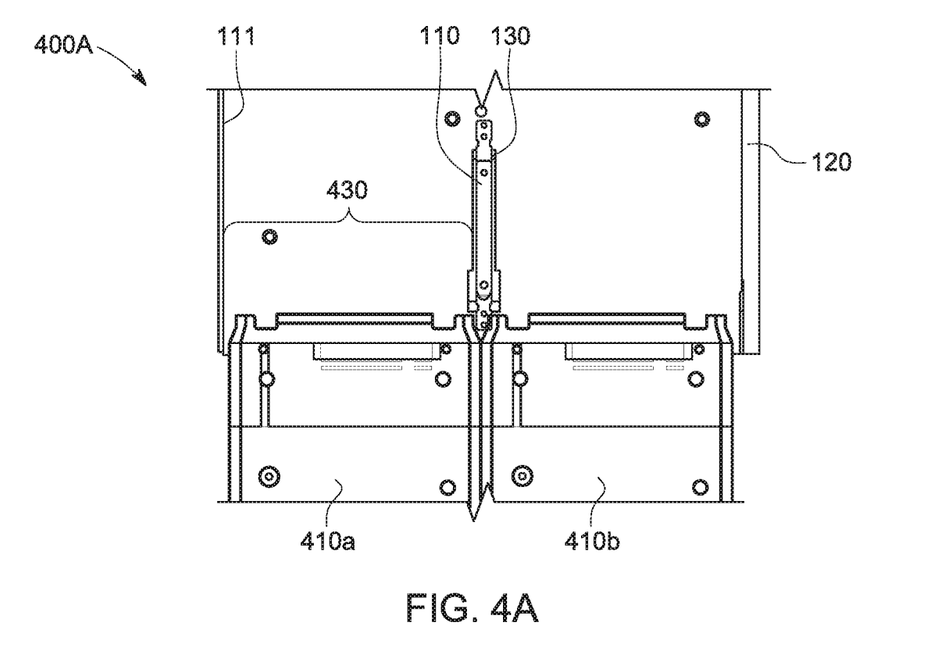
FIG. 4A shows an exemplary first configuration of the disclosed chassis, according to an embodiment of the present disclosure.

FIG. 1 shows that the flexible partition 110 can be received into an opening 130 in the chassis body 120. For example, the opening 130 can be a set distance from an edge of the chassis body 120, wherein the set distance corresponds to a width of a module (as shown in FIG. 4A). The flexible partition 110 can have two opposing end portions 114a and 114b. Each end portion 114a and 114b can couple to the chassis body 120, via receiving portions 116a, 116b, 116c, and 116d. For example, receiving portions 116a, 116b, 116c, and 116d can mechanically couple with the chassis body 120 via screws, snapping mechanisms, nails, hook and loop fasteners, and any other mechanical fastener as known in the art.

Middle portion 112 can be configured to bend in response to an applied force. In some examples, middle portion 112 can be made from any of: a plastic, a metal, a metal/plastic composite, and any other material which is flexible in response to an applied force, as readily contemplated by one skilled in the art. Middle portion 112 can include tapered ends 113a and 113b which can allow modules to slide over middle portion 112.

In a natural state with no forces applied to the partition 110, middle portion 112 can be in a raised position above the chassis body 120. The end portions 114a and 114b can be at or below the chassis body 120. Thereby, the end portions 114a and 114b will not interfere with modules slidably received into chassis body 120. When force is applied to the partition 110, middle portion 112 can bend towards the chassis body 120, and can shift into a lowered position. In a lowered position, the middle portion 112 can be parallel to, or below, chassis body 120.

Figure 2A:
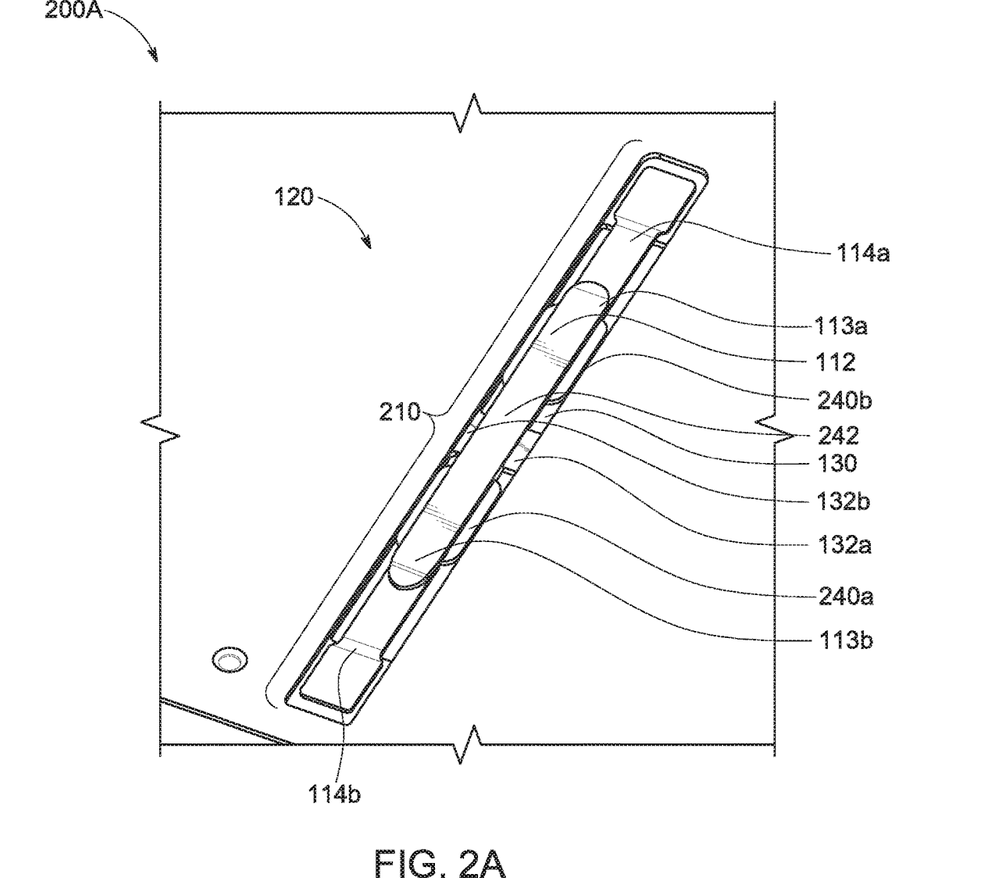
FIG. 2A-2B show an exemplary partition with options, according to an embodiment of the present disclosure.
Figure 2B:
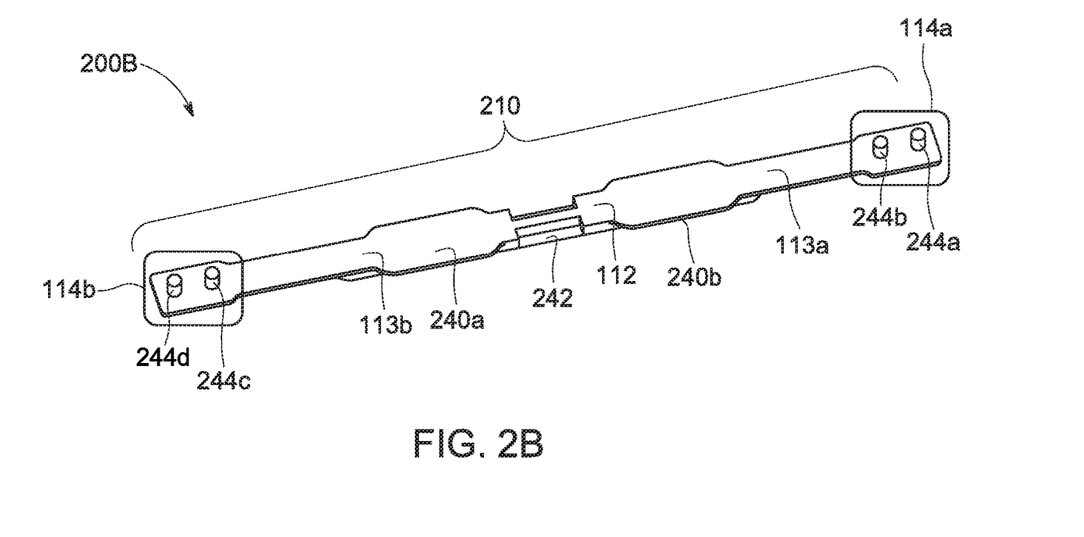

FIGS. 2A-2B show an exemplary partition 210 with options, according to an embodiment of the present disclosure. FIG. 2A shows a configuration 200A, where partition 210 is received within an opening 130 of a chassis body 120. FIG. 2B shows a configuration 200B, where partition 210 stands alone. FIGS. 2A-2B can include many components and similar labels to FIG. 1. In addition, FIGS. 2A-2B can include partition 210, lips 240a and 240b; option 242; indents 132a and 132b; and male connectors 244a, 244b, 244c, and 244d.

Partition 210 can have many of the features of partition 110 of FIG. 1. In addition, partition 210 can be configured to fit within an opening 130 of a chassis body 120, where the opening 130 contains indents 132a and 132b. Partition 210 can include lips 240a and 240b along the length of middle portion 112, and the lips 240a and 240b can be positioned on either side of the indents 132a and 132b. End portions 114a and 114b can further include male connectors 244a, 244b, 244c, and 244d, which can couple with chassis body 120. Although particular connectors male connectors 244a, 244b, 244c, and 244d are shown in FIG. 2B, the disclosed partition 210 can use any type of mechanical fastener, as discussed above with respect to partition 110. In some examples of partition 210, option 242 can snap into the indents 132a and 132b when middle portion 112 is in a lowered position. For example, the partition 210 can be flush with a chassis body 120 when in a lowered position.

Figure 3:
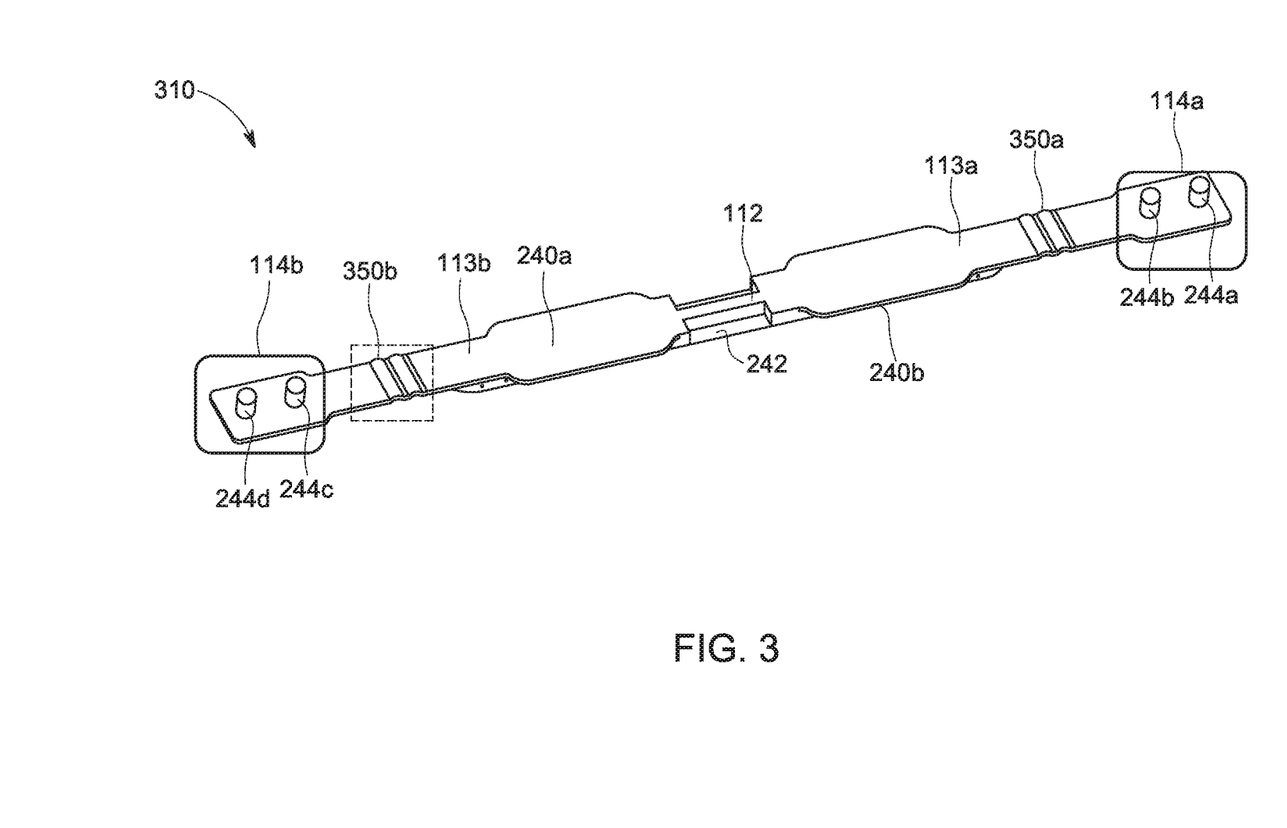
FIG. 3 shows an exemplary partition with ridges, according to an embodiment of the present disclosure.

FIG. 3 shows an exemplary partition 310 with ridges. Partition 310 can have many of the features of partition 210 of FIGS. 2A-2B. Partition 310 can additionally include ridges 350a and 350b, which can increase the flexibility of middle portion 112. In some examples, a first set of ridges 350 can be adjacent to the first end portion 114a, and a second set of ridges 350b can be adjacent to the second end portion 114b. The ridges 350a and 350b can allow the middle portion 112 to bend along creases in the ridges 350a and 350b when a downward force is applied to middle portion 112. When bent along the creases in the ridges 350a and 350b, the partition 310 can have a flat appearance such that the middle portion 112 is at the same height of end portions 114a and 114b. For example, the partition 310 can be flush with a chassis body when in a lowered position.

Although particular designs are shown for the flexible partition, as shown in FIGS. 1-3, the present disclosure contemplates that any design can be used which provides a partition with (1) a resting position above a chassis body and (2) a lowered position where the middle portion 112 is at the same height of end portions 114a and 114b.

FIG. 4A shows an exemplary first configuration 400A of the disclosed chassis, according to an embodiment of the present disclosure. Configuration 400A can include the flexible partition 110, chassis body 120, and opening 130 of FIG. 1. Configuration 400A can further include modules 410a and 410b.

The opening 130 can be a set distance 430 from an edge 411 of the chassis body 120, wherein the set distance 430 corresponds to the width of module 410a. Modules 410a and 410b can be computer modules, which house a plurality of computer components. Configuration 400A can therefore receive two removable modules 410a and 410b. In configuration 400A, partition 110 will be in a raised position to physically separate module 410a from module 410b. Although modules 410a and 410b are shown only partially loaded into chassis body 120, modules 410a and 410b can be slidably received fully into chassis body 120. Additionally, although partition 110 is shown in FIG. 4A, any partition disclosed herein can be used in configuration 400A.

Figure 4B:
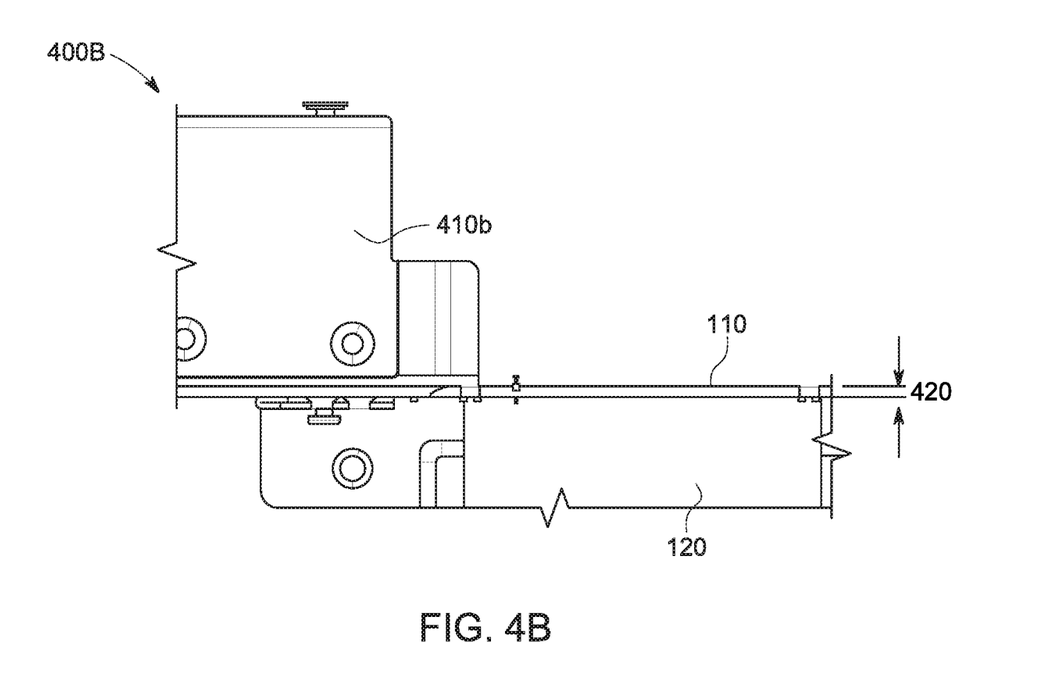
FIG. 4B demonstrates a side view of a configuration where a removeable module is sliding into a chassis body, according to an embodiment of the present disclosure.

FIG. 4B demonstrates a side view of a configuration 400B where a removeable module is sliding into a chassis body. Configuration 400B can include the flexible partition 110, chassis body 120, and removeable module 410b of FIG. 4A. Additionally, although partition 110 is shown in FIG. 4B, any partition disclosed herein can be used in configuration 400B. FIG. 4B shows that the flexible partition 110 maintains a resting position even when removeable module 410b is received by chassis body 120. In the resting position, the flexible partition 110 can be elevated a distance 420 above the chassis body 120. This distance 420 can allow for physical separation of two removeable modules (e.g., removeable modules 410a and 410b of FIG. 4B).

Figure 5A:
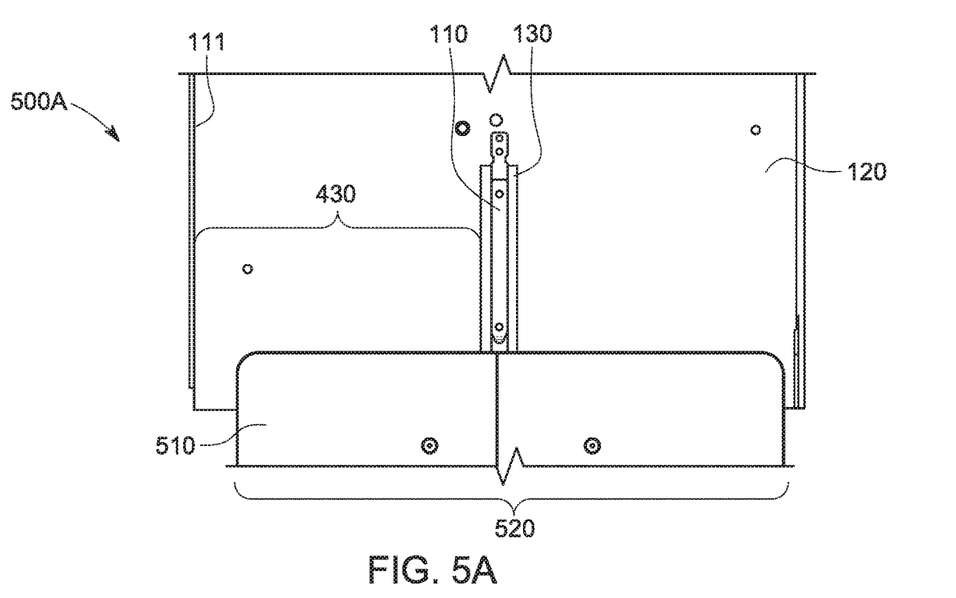
FIG. 5A shows an exemplary second configuration of the disclosed chassis, according to an embodiment of the present disclosure.

FIG. 5A shows an exemplary second configuration 500A of the disclosed chassis, according to an embodiment of the present disclosure. Configuration 500A can include the flexible partition 110, chassis body 120, opening 130, and set distance 430 as discussed above with respect to FIG. 4A. Configuration 500A can further include a removable module 510.

Removable module 510 can be computer module that houses a plurality of computer components. Removeable module 510 can have a width 520 which is greater than a set distance 430 between the flexible partition 110 and an edge 111 of the chassis body 120. In configuration 500A, partition 110 will be in a lowered position, as module 510 slidably extends over partition 110. Although module 510 is shown only partially loaded into chassis body 120, module 510 can be slidably received fully into chassis body 120. Additionally, although partition 110 is shown in FIG. 5A, any partition disclosed herein can be used in configuration 500A.

Figure 5B:
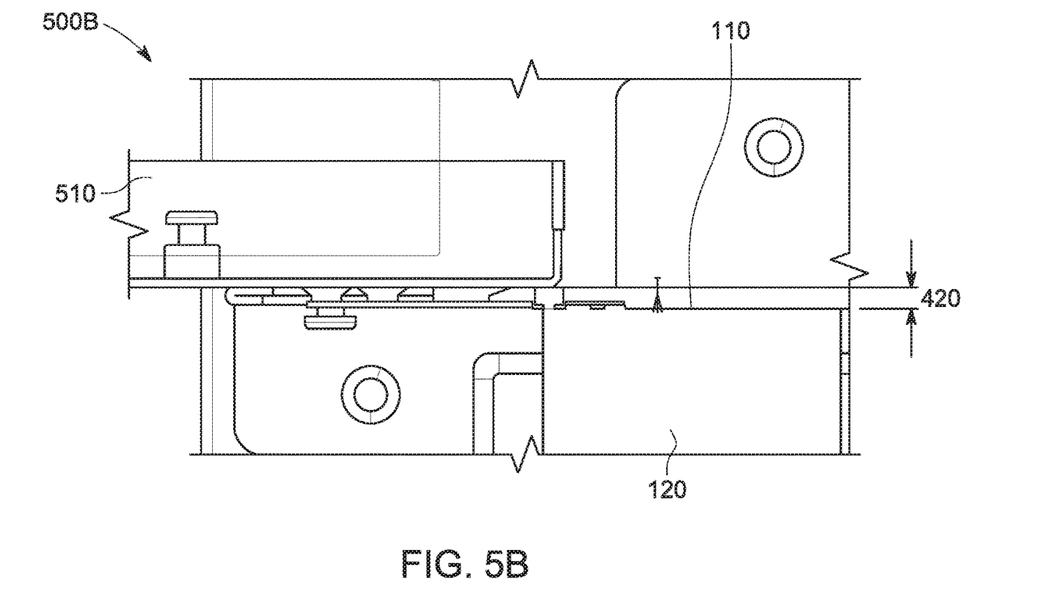
FIG. 5B demonstrates a side view of a configuration 400B where a removeable module is sliding into a chassis body, according to an embodiment of the present disclosure.

FIG. 5B demonstrates a side view of a configuration 400B where a removeable module is sliding into a chassis body. Configuration 500B can include the flexible partition 110, chassis body 120, and removeable module 510 of FIG. 5A. Additionally, although partition 110 is shown in FIG. 5B, any partition disclosed herein can be used in configuration 500B. FIG. 5B shows that the flexible partition 110 transitions into a lowered position when removeable module 510 is received by chassis body 120. In the lowered position, the flexible partition 110 can be lowered by a distance 420, so that the removeable partition 110 is flush with the chassis body 120. Therefore, the flexible partition 110 does not interfere with the loading of a removeable module 510, where the removeable module 510 has a width greater than a distance 430 of between the flexible partition 110 and an edge 111 of the chassis body 120.

Therefore, FIGS. 4A-5B demonstrate that the same partition, opening, and chassis body can receive a variety of module configurations.

Figure 6:
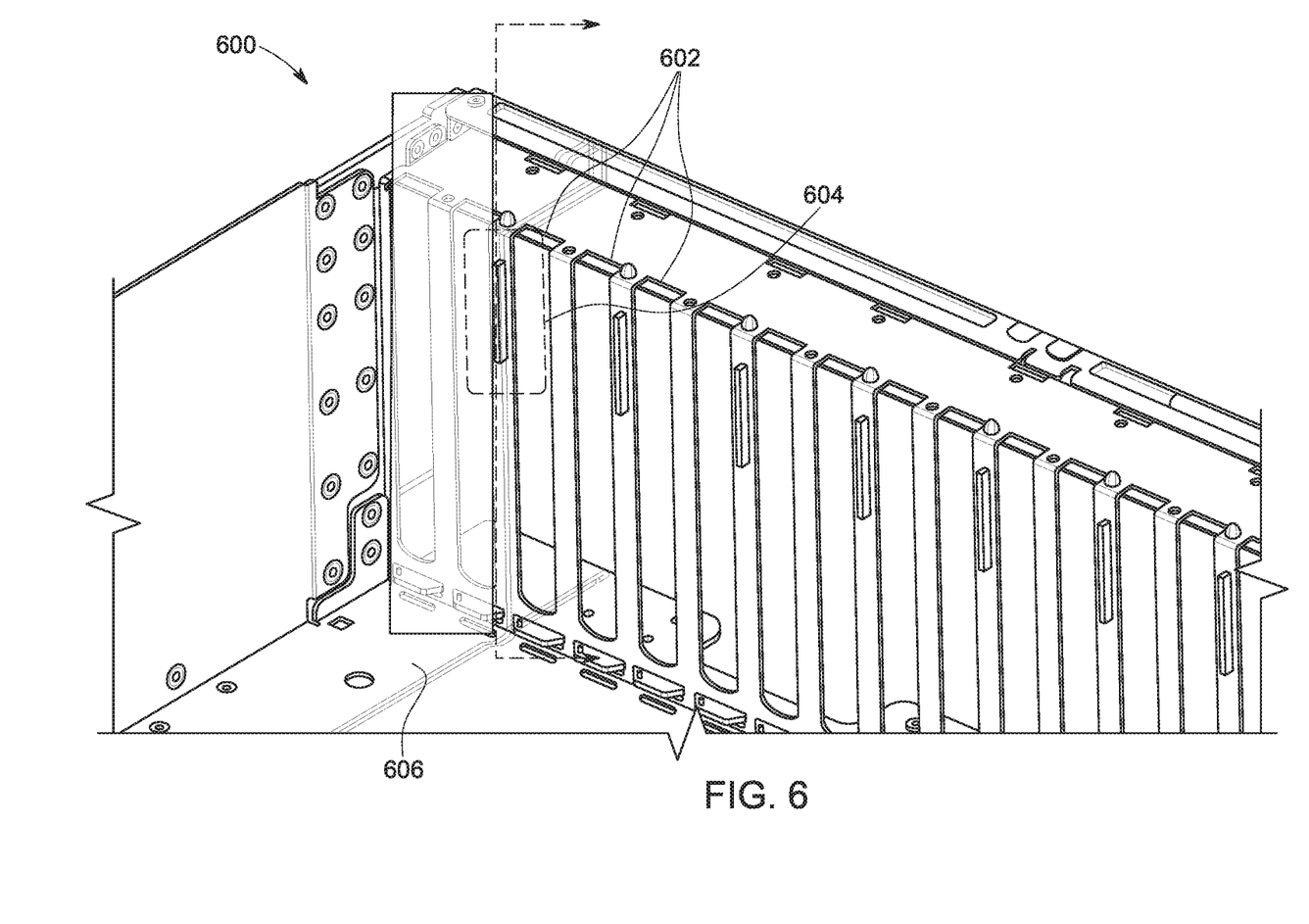
FIG. 6 shows an exemplary server to demonstrate additional features of the disclosed partition, according to an embodiment of the present disclosure.

FIG. 6 shows an exemplary server 600, in which the disclosed partition (not pictured) can be installed. Server 600 includes a plurality of slots 602, an interior opening 604, and a base line 606. Each slot 602 can have an interior opening 604 to receive a module, and a base line 606. A user can desire that a module (not pictured) be received in a particular position. An exemplary module can be modules 410a, 410b, or 510, as discussed above with respect to FIGS. 4 and 5. An exemplary partition (not pictured), according to the various embodiments discussed above with respect to FIGS. 1-5B, can be positioned within the interior portion 604 of one or more of the slots 602. When a slot 602 receives a module (not pictured), the disclosed partition will move above or below the baseline 606, according to the type of module shown. Therefore, FIG. 6 demonstrates that a plurality of partitions can be used in a plurality of slots 602 in an exemplary partition, according to an embodiment of the present disclosure.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:
1. A partition for a chassis, comprising:
 a first opposing end portion and a second opposing end portion, each of the first opposing end portion and the second opposing end portion comprising a receiving element to couple with a chassis body, each of the first and second opposing end portion having a resting position adjacent with or below a floor of the chassis body; and
a middle portion, the middle portion configured to be in a raised position above the floor of the chassis body, and the middle portion being flexible to bend towards the floor of the chassis body, wherein the first opposing end portion and the second opposing end portion comprise ridges configured to increase flexibility of the partition.

2. The partition of claim 1, further comprising a lowered position, wherein the middle portion is at or below the floor of the chassis body.

3. The partition of claim 2, wherein the middle portion is configured to shift into the lowered position upon receiving an applied force.

4. The partition of claim 1, wherein the middle portion comprises at least one of: a plastic, a metal, and a metal/plastic composite.

5. The partition of claim 1, wherein the middle portion comprises a flat center and tapered ends adjacent to the first opposing end portion and the second opposing end portion.

6. The partition of claim 1, wherein the first opposing end portion and the second opposing end portion comprise at least one stake configured to mechanically couple with a receiving portion of the chassis floor.

7. A partition for a chassis, comprising:
a first opposing end portion and a second opposing end portion, each of the first opposing end portion and the second opposing end portion comprising a receiving element to couple with a chassis body, each of the first and second opposing end portion having a resting position adjacent with or below a floor of the chassis body; and
a middle portion, the middle portion configured to be in a raised position above the floor of the chassis body, and the middle portion being flexible to bend towards the floor of the chassis body, wherein the middle portion comprises an option for receiving indents.

8. A chassis, comprising:
at least one removable module;
a chassis body, configured to receive the at least one removable module, the chassis body further comprising a chassis body opening; and
a flexible partition configured to be received within the chassis body opening, the flexible partition further comprising:
a first opposing end portion and a second opposing end portion, each of the first opposing end portion and the second opposing end portion comprising a receiving element to couple with a chassis body, each of the first and second opposing end portion having a resting position adjacent with or below a floor of the chassis body; and
a middle portion, the middle portion configured to be in a raised position above the floor of the chassis body, and the middle portion being flexible to bend towards the floor of the chassis body, wherein the first opposing end portion and the second opposing end portion comprise ridges configured to increase flexibility of the flexible partition.

9. The chassis of claim 8, further comprising a lowered position, wherein the middle portion is at or below the floor of the chassis body.

10. The chassis of claim 9, wherein the partition is configured to transition into the lowered position based on an applied force to the middle portion.

11. The chassis of claim 10, wherein the at least one removable module is configured to slidably extend over the partition when transitioning into the chassis body, thereby applying a force to the middle portion of the flexible partition.

12. The chassis of claim 8, wherein the middle portion comprises at least one of: a plastic, a metal, and a metal/plastic composite.

13. The chassis of claim 8, wherein the middle portion comprises a flat center and tapered ends adjacent to the first opposing end portion and the second opposing end portion.

14. The chassis of claim 8, wherein the first opposing end portion and the second opposing end portion comprise at least one stake configured to mechanically couple with a receiving portion of the chassis body.

15. The chassis of claim 8, wherein a first module of the at least one removable module is received on a first side of the flexible partition, and a second module of the at least one removable module is received on a second side of the flexible partition.

16. A chassis, comprising:
at least one removable module;
a chassis body, configured to receive the at least one removable module, the chassis body further comprising a chassis body opening; and
a flexible partition configured to be received within the chassis body opening, the flexible partition further comprising:
a first opposing end portion and a second opposing end portion, each of the first opposing end portion and the second opposing end portion comprising a receiving element to couple with a chassis body, each of the first and second opposing end portion having a resting position adjacent with or below a floor of the chassis body; and
a middle portion, the middle portion configured to be in a raised position above the floor of the chassis body, and the middle portion being flexible to bend towards the floor of the chassis body, wherein the opening further comprises at least one indent, and wherein the middle portion comprises an option for receiving the at least one indent.

\* \* \* \* \*